(12) United States Patent
Hori

(10) Patent No.: US 8,964,860 B2
(45) Date of Patent: Feb. 24, 2015

(54) DIGITAL MODULATOR

(75) Inventor: Shinichi Hori, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 14/115,566

(22) PCT Filed: Mar. 13, 2012

(86) PCT No.: PCT/JP2012/056334
§ 371 (c)(1),
(2), (4) Date: Nov. 4, 2013

(87) PCT Pub. No.: WO2012/153567
PCT Pub. Date: Nov. 15, 2012

(65) Prior Publication Data
US 2014/0219384 A1 Aug. 7, 2014

(30) Foreign Application Priority Data
May 10, 2011 (JP) .................................. 2011-105156

(51) Int. Cl.
*H04B 14/06* (2006.01)
*H04L 27/12* (2006.01)
*H03M 3/00* (2006.01)

(52) U.S. Cl.
CPC *H04L 27/12* (2013.01); *H03M 3/48* (2013.01)
USPC ........... 375/247; 375/244; 375/242; 375/295; 375/296; 341/144; 341/143; 341/152; 341/155; 341/172

(58) Field of Classification Search
CPC ......... H04L 27/368; H04L 27/12; H03M 3/48
USPC .......... 375/247, 244, 242, 295, 296; 341/144, 341/143, 155, 152, 172
See application file for complete search history.

(56) References Cited

U.S. PATENT DOCUMENTS 7,928,876 B2 * 4/2011 Thomsen et al. ............. 341/143
8,665,127 B2 * 3/2014 Silva ............................ 341/143

(Continued)

FOREIGN PATENT DOCUMENTS

EP 1134899 9/2001
EP 1487111 12/2004

(Continued)

OTHER PUBLICATIONS

Frappé, A. et al. "A Digital ΔΣ RF Signal Generator for Mobile Communication Transmitters in 90nm CMOS", IEEE RFIC Symposium, Jun. 2008, p. 13-16.
International Search Report corresponding to PCT/JP2012/056334, dated May 10, 2012, 5 pages.

*Primary Examiner* — Kenneth Lam
(74) *Attorney, Agent, or Firm* — Wilmer Cutler Pickering Hale and Dorr LLP

(57) ABSTRACT

To provide a digital modulator including: a signal adjuster (105) which is provided with a plurality of output lines, and which outputs, to the output line, which corresponds to a range to which a level of an input signal belongs, a signal of a level corresponding to the level of the input signal; a plurality of internal digital modulators (111-1 to 111-N), each of which is provided so as to correspond to each of the plurality of output lines and carries out delta-sigma modulation on the signal of the corresponding output line to output the modulated signal; and an encoder (113) which encodes the plurality of modulated signals respectively outputted by the plurality of internal digital modulators.

16 Claims, 10 Drawing Sheets

(56) References Cited

U.S. PATENT DOCUMENTS

| | | |
|---|---|---|
| 2001/0026234 A1 | 10/2001 | Nakao et al. |
| 2002/0163454 A1* | 11/2002 | Yap et al. ............... 341/137 |
| 2003/0112165 A1* | 6/2003 | Al-Awadhi ............ 341/143 |
| 2004/0252038 A1 | 12/2004 | Robinson et al. |
| 2005/0190854 A1* | 9/2005 | Shakeshaft et al. ...... 375/295 |
| 2005/0202790 A1* | 9/2005 | Matsuura et al. ........ 455/118 |
| 2012/0213531 A1* | 8/2012 | Nazarathy et al. ...... 398/202 |
| 2013/0177062 A1* | 7/2013 | Hori et al. ............... 375/227 |
| 2013/0257485 A1* | 10/2013 | Nikaeen et al. ......... 327/107 |

FOREIGN PATENT DOCUMENTS

| | | |
|---|---|---|
| JP | 05-063457 | 3/1993 |
| JP | 10-022829 | 1/1998 |
| JP | 2001-332973 | 11/2001 |
| JP | 2005-006273 | 1/2005 |
| JP | 2006-108892 | 4/2006 |
| JP | 2009-540656 | 11/2009 |
| JP | 2011-077979 | 4/2011 |
| WO | WO-2011/078120 | 6/2011 |
| WO | WO-2012/017580 | 2/2012 |

* cited by examiner

DIGITAL MODULATOR

CROSS-REFERENCE TO RELATED APPLICATIONS

This application is a national stage application of International Application No. PCT/JP2012/056334 entitled "Digital Modulator," filed on Mar. 13, 2012, which claims the benefit of the priority of Japanese patent application no. 2011-105156, filed on May 10, 2011, the disclosures of each of which are hereby incorporated by reference in their entirety.

TECHNICAL FIELD

The present invention relates to a transmission circuit used in a communication apparatus, such as a portable telephone and a wireless LAN (Local Area Network), and to a digital modulator included in the transmission circuit. The present invention also relates to a transmission method performed by the transmission circuit and to a digital modulation method performed by the digital modulator.

BACKGROUND ART

A transmission section of a communication apparatus, such as a portable telephone and a wireless LAN, is required to operate at low power consumption while maintaining the accuracy of transmission signals, regardless of the magnitude of the output power. In particular, the amount of power consumed in a power amplifier of the final stage of the transmission section of the communication apparatus is a half or more of the power consumed in the entire communication apparatus, and hence the power amplifier needs to have high power efficiency.

In recent years, a switching amplifier has been attracting attention as a power amplifier which is expected to have high power efficiency. On the assumption that a pulse waveform signal is to be inputted, as an input signal, into the switching amplifier, the switching amplifier power-amplifies the pulse waveform signal while maintaining the waveform of the signal. The pulse waveform signal that is amplified by the switching amplifier is radiated into the air from an antenna after the frequency components of the pulse waveform signal other than desired frequency components are sufficiently reduced by a filter element.

FIG. 1 shows a class-D amplifier which is a typical example of the switching amplifier. The class-D amplifier includes a configuration in which two switch elements are inserted in series between a power supply and the ground. Complementary pulse signals are inputted into the two switch elements as opening/closing control signals so that only one of the switches is turned on. The output of the amplifier is controlled in such a manner that, when the switch on the power supply side is turned on and when the switch on the ground side is turned off, a voltage equal to the power supply voltage is outputted, and that, when the switch on the power supply side is turned off and when the switch on the ground side is turned on, a voltage equal to the ground potential is outputted.

This class-D amplifier does not need any bias current, and hence ideally no power loss occurs. Note that the switch element can be configured by an MOS (Metal Oxide Semiconductor) field-effect transistor or a bipolar transistor.

As a configuration example of an entire transmitter using the class-D amplifier, FIG. 2 shows a configuration described in Non-patent Literature 1. For example, when W-CDMA (Wideband-Code Division Multiple Access) is taken as an example, a radio signal is generated as a multi-bit signal of 10 bits or more by, for example, a digital baseband (hereinafter referred to as a DBB) processor. On the other hand, the input signal of the class-D amplifier is a pulse waveform signal. Since the pulse waveform signal can transmit only a one-bit signal, the output signal from the DBB processor needs to be converted into one-bit signals beforehand. In this configuration example, in order to maintain desired noise characteristics near a frequency band of a desired radio wave, a $\Delta\Sigma$ (delta sigma) modulator is used as means to convert the multi-bit signal into one-bit signals. With this configuration, it is possible that, while desired noise characteristics of the radio signal are maintained, the radio signal is converted into a pulse waveform signal, so as to be inputted into the class-D amplifier.

Patent Literature 1 describes an invention in which the level of a signal is adjusted before the signal is subjected to delta-sigma modulation.

Patent Literature 2 describes an invention which relates to a circuit for performing analog-to-digital conversion by using a plurality of delta-sigma modulators arranged in parallel with each other.

CITATION LIST

Patent Literature

Patent Literature 1: JP2006-108892A
Patent Literature 2: JP2009-540656A

Non-patent Literature

Non-patent Literature 1: A. Frappe, B. Stefanelli, A. Flament, A. Kaiser, and A. Cathelin, "A digital $\Delta\Sigma$ RF signal generator for mobile communication transmitters in 90 nm CMOS," in IEEE RFIC Symp., pp. 13-16, June 2008

SUMMARY OF INVENTION

Technical Problem

FIG. 3 shows a configuration example of a delta-sigma modulator. The delta-sigma modulator includes an adder, a delay device, and a quantizer. When an input signal is set as $U(z)$ and an output signal is set as $V(z)$, and when quantization noise generated by the quantizer is set as $E(z)$, the following expression is realized.

$$V(z)=U(z)+(1-z^{-1})\cdot E(z) \qquad (1)$$

Noise $N(z)$ included in the output signal is expressed by the following expression.

$$N(z)=(1-z^{-1})\cdot E(z) \qquad (2)$$

In the above expression, z is expressed as follows.

$$z=\exp(2\pi j f/fclk) \qquad (3)$$

Here, f is a signal frequency, and fclk is a clock frequency of the delta-sigma modulator.

Therefore, when the signal band occupied by a desired signal is set as fB, the noise in the signal band is expressed by the following expression.

[Expression 1]

$$\int_0^{f_B} \left|1 - \exp\left(-\frac{2\pi jf}{f_{clk}}\right)\right| \cdot |E(z)| \cdot df \quad (4)$$

The above expression means that, in order to reduce the noise, it is necessary to reduce the quantization noise E (z) itself generated by the quantizer, or to increase the operation clock frequency of the delta-sigma modulator. Note that E(z) can be reduced by improving the comparison resolution of the quantizer.

In Non Patent Literature 1, a delta-sigma modulator is reported which is manufactured by using a 90-nm CMOS process and which can be operated at 4 GSps.

However, when the modulator described in Non Patent Literature 1 is assumed to be used in a signal processing apparatus, such as a portable telephone and a wireless LAN, the modulator cannot realize good noise characteristics. In order to realize a delta-sigma modulator having noise characteristics that are also applicable to a portable telephone and a wireless LAN, it is necessary to further increase the operation speed of the modulator or to further reduce the quantization noise of the modulator. Generally, in order to reduce the quantization noise in a delta-sigma modulator, it is necessary to improve the resolution of the quantizer. However, when the resolution of the quantizer is improved, the number of times of comparison operations in the quantizer needs to be increased, which causes a reduction in the operation speed of the modulator.

The invention described in Patent Literature 1 is intended to optimize the dynamic range of a variable gain amplifier and is not intended to solve the above-described problem.

In the invention described in Patent Literature 2, an identical analog input signal is inputted into all the delta-sigma modulators, and the digital output and the remainder from the delta-sigma modulators are only processed.

An object of the present invention is to provide a digital modulator and a transmission circuit including the digital modulator which can realize both a reduction of quantization noise and a high speed operation, and also to provide a digital modulation method and a transmission method which are respectively used for the digital modulator and the transmission circuit.

Solution to Problem

According to a first aspect of the present invention, there is provided a digital modulator including: a signal adjuster which includes a plurality of output lines, and which outputs, to the output line, which accommodates a range to which the level of an input signal belongs, a signal whose level corresponds to the level of the input signal; a plurality of internal digital modulators each of which is provided so as to correspond to each of the plurality of output lines, and each of which carries out delta-sigma modulation on the signal of the corresponding output line and outputs the modulated signal; and an encoder which encodes the plurality of modulated signals respectively outputted by the plurality of internal digital modulators.

Further, according to a second aspect of the present invention, there is provided a transmission circuit including: the above-described digital modulator; a multiplier which multiplies an output of the digital modulator by an output of a digital oscillator; and an amplifier which connects an output line to a power supply having a voltage corresponding to a level of the output of the multiplier.

Further, according to a third aspect of the present invention, there is provided a digital modulation method including: a step in which a signal adjuster provided with a plurality of output lines outputs, to the output line, which accommodates a range to which the level of an input signal belongs, a signal whose level corresponds to the level of the input signal; a step in which each of a plurality of internal digital modulators, each provided so as to correspond to each of the plurality of output lines, carries out delta-sigma modulation on the signal whose corresponds output line and outputs the modulated signal; and a step in which an encoder encodes the plurality of modulated signals respectively outputted by the plurality of internal digital modulators.

Further, according to a fourth aspect of the present invention, there is provided a transmission method including: each of the steps of the digital modulation method; a step in which a multiplier multiplies an output of the digital modulator by an output of a digital oscillator; and a step in which an amplifier connects an output line to a power supply having a voltage corresponding to a level of the output of the multiplier.

Advantageous Effect of Invention

According to the present invention, it is possible to realize the reduction of quantization noise and the high-speed operation.

DESCRIPTION OF EMBODIMENTS

In the following, exemplary embodiments will be described with reference to the accompanying drawings.
(A First Exemplary Embodiment)

Figure 4:
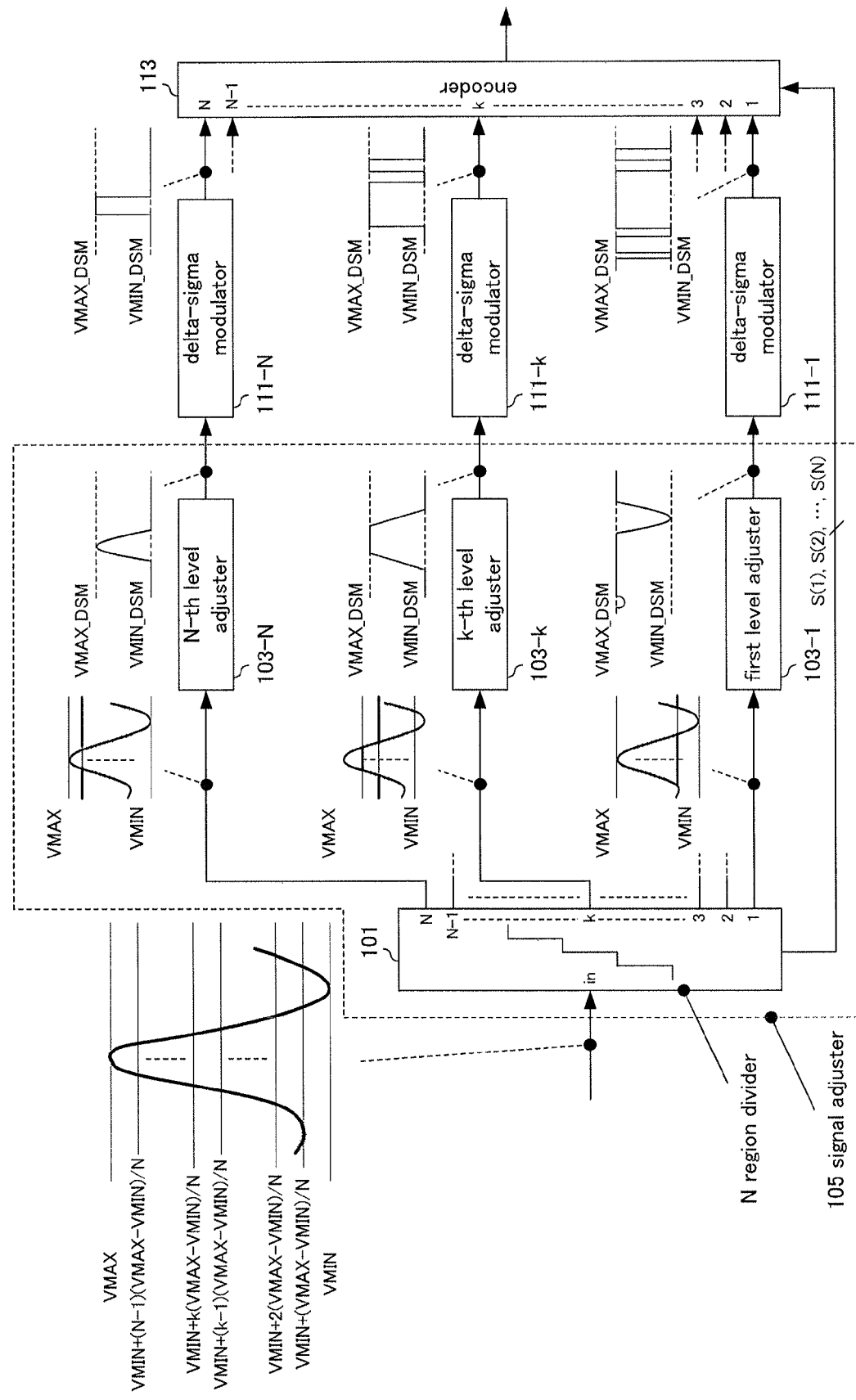
FIG. 4 is a circuit block diagram showing a configuration example of a digital modulator according to a first exemplary embodiment.

FIG. 4 is a circuit block diagram showing a parallel multi-bit delta-sigma modulator which is a digital modulator according to an exemplary embodiment. In FIG. 4, the digital modulator according to the exemplary embodiment includes N region divider 101, first to N-th level adjusters 103-1 to 103-N, delta-sigma modulators 111-1 to 111-N, and encoder 113.

N region divider 101 has N output terminals (N is an arbitrary integer of one or more, and the N output terminals are respectively referred to as a first output terminal, a second output terminal, . . . , an N-th output terminal), and outputs a signal from one output terminal designated according to a range including the signal level of an input signal. When the maximum and minimum values of the range of voltage which can be inputted into N region divider 101 are respectively set as VMAX and VMIN, and when input signal voltage Vin is in the following range, N region divider 101 outputs input signal Vin from the k-th output terminal (k is an arbitrary integer between 1 and N) as-is.

$$VMIN+(k-1)\cdot(VMAX-VMIN)/N < Vin < VMIN+k\cdot(VMAX-VMIN)/N \quad (5)$$

Note that each of the two inequality signs of the expression may be suitably replaced by the sign ≤.

Further, when the input signal voltage satisfies expression (5), a fixed voltage value is outputted from the terminals other than the k-th output terminal.

For example, when p is set to an integer between 1 and k−1, a voltage of a value expressed by the following expression is outputted from the p-th output terminal.

$$VMIN+p\cdot(VMAX-VMIN)/N \quad (6)$$

Another value may be outputted from the p-th output terminal.

Moreover, when q is set to an integer between k+1 and N, a voltage of a value expressed by the following expression is outputted from the q-th output terminal.

$$VMIN+(q-1)\cdot(VMAX-VMIN)/N \quad (7)$$

Another value may be outputted from the q-th output terminal.

In the case where the values expressed by expressions (6) and (7) are respectively used as outputs of the p-th terminal and the q-th terminal, this means that, when r is set to an arbitrary integer, the maximum value of the voltage signal outputted from the r-th output terminal of the N region divider is expressed by the following expression.

$$VMIN+r\cdot(VMAX-VMIN)/N$$

Also, this means that the minimum value of the voltage signal outputted from the r-th output terminal is expressed by the following expression.

$$VMIN+(r-1)\cdot(VMAX-VMIN)/N$$

Moreover, N region divider 101 generates N control signals of S(1), S(2), . . . , S(N). In the case where the signal inputted into N region divider 101 is in the range expressed by expression (5), control signal S(k) is set to 1, and the other control signals S(1), . . . , S(k−1), S(k+1), . . . , S(N) are set to 0. That is, the control signal expresses the level of input signal Vin of N region divider 101 in N stages. The control signals are inputted into encoder 113 and used for internal arithmetic processing in encoder 113.

The digital modulator according to the exemplary embodiment includes N level adjusting circuits. That is, the digital modulator according to the exemplary embodiment includes a first level adjusting circuit, a second level adjusting circuit, . . . , an N-th level adjusting circuit. As will be described below, each of the N level adjusting circuits adjusts the signal voltage of each of the output terminals of N region divider 101 so that the signal voltage falls within the input possible voltage range of each of delta-sigma modulators 111-1 to 111-N respectively provided at the subsequent stages of the level adjusting circuits.

K-th level adjusting circuit 103-k (k is an arbitrary integer between 1 and N) receives, as an input signal, the signal outputted from the k-th output terminal of N region divider 101. When the input signal is set as Vtune_in_k, k-th level adjusting circuit 103-k generates output signal Vtune_out_k according to the following expression.

$$Vtune\_out\_k = A \cdot N \cdot Vtune\_in\_k - A \cdot (N-k+1) \cdot VMIN - A \cdot (k-1) \cdot VMAX + VMIN\_DSM \quad (8)$$

In expression (8), A is given as follows.

$$A = (VMAX\_DSM - VMIN\_DSM)/(VMAX - VMIN)$$

VMAX_DSM and VMIN_DSM respectively denote the maximum value and the minimum value of the input possible range of delta-sigma modulator 111-k provided at a subsequent stage of the level adjusting circuit.

The above expression means that Vtune_in_k is amplified A·N times in level adjusting circuit 103-k. The maximum value, which Vtune_in_k can take, is expressed by the following expression.

$$VMIN+k\cdot(VMAX-VMIN)/N$$

Also, the minimum value, which Vtune_in_k can take, is expressed by the following expression.

$$VMIN+(k-1)\cdot(VMAX-VMIN)/N$$

Therefore, the above expressions mean that the maximum and minimum values of the output signal of k-th level adjusting circuit 103-k are respectively equal to VMAX_DSM and VMIN_DSM. That is, in each of first level adjusting circuit 103-1 to N-th level adjusting circuit 103-N, the maximum and minimum values of the output signal are set to VMAX_DSM and VMIN_DSM, respectively.

The digital modulator according to the exemplary embodiment includes N delta-sigma modulators 111-1 to 111-N (that is, first delta-sigma modulator 111-1 to N-th delta-sigma modulator 111-N), and the output signals of first level adjuster 103-1 to N-th level adjuster 103-N are inputted to first delta-sigma modulator 111 to N-th delta-sigma modulator 111-N, respectively.

Figure 1:
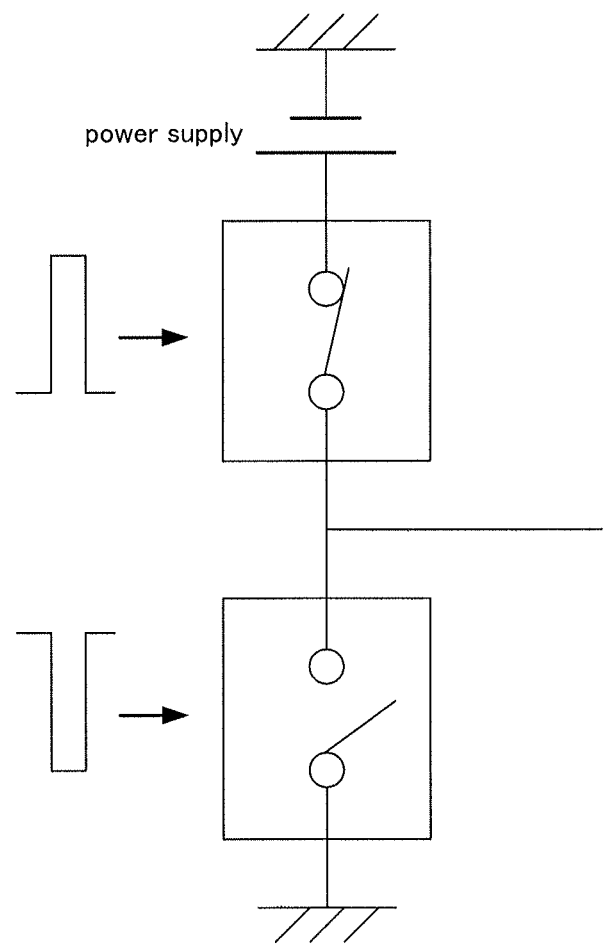
FIG. 1 is a circuit block diagram showing a configuration example of an ordinary class-D amplifier.
Figure 2:
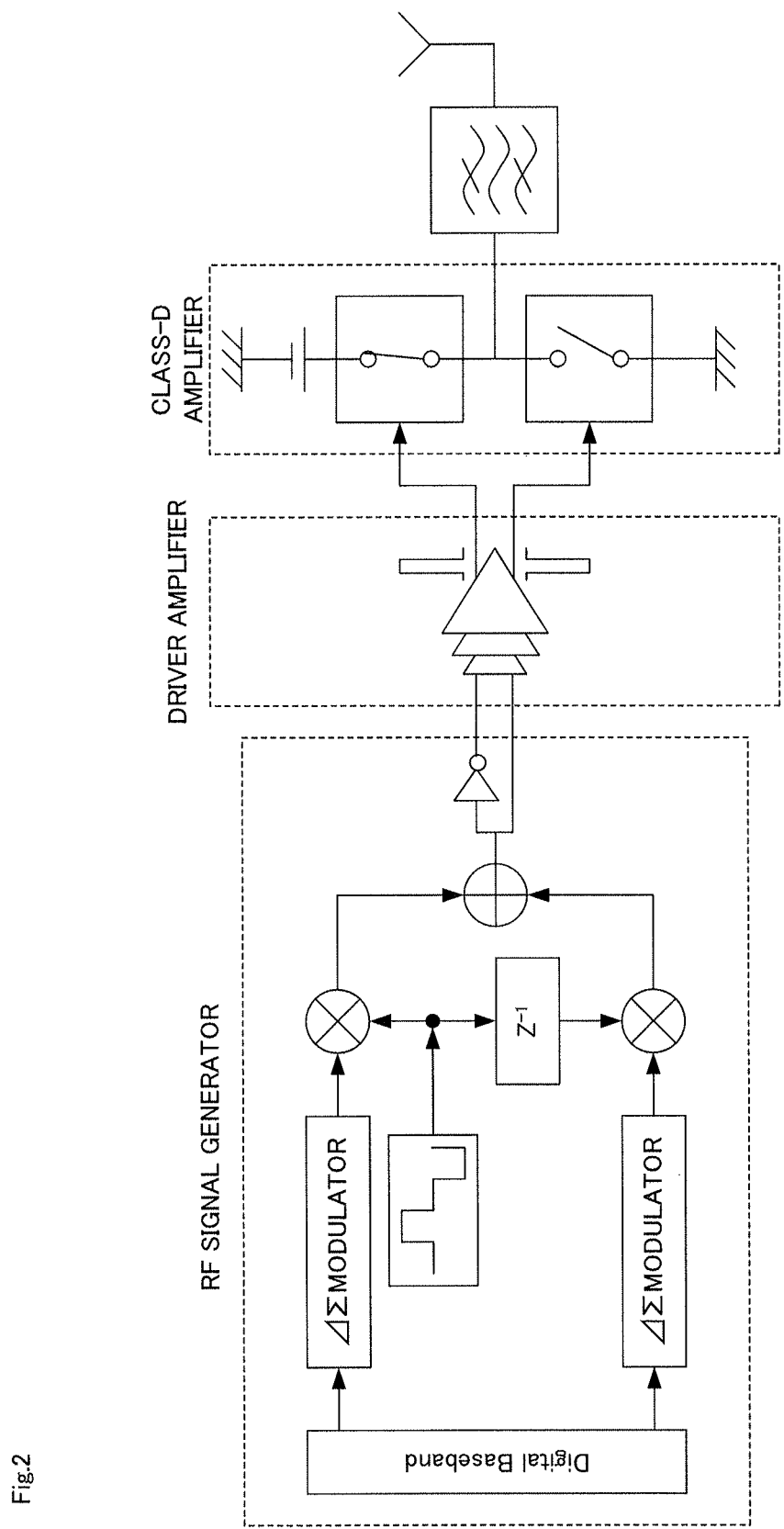
FIG. 2 is a circuit block diagram showing a configuration example of a transmission circuit in which a conventional class-D amplifier is used.
Figure 3:
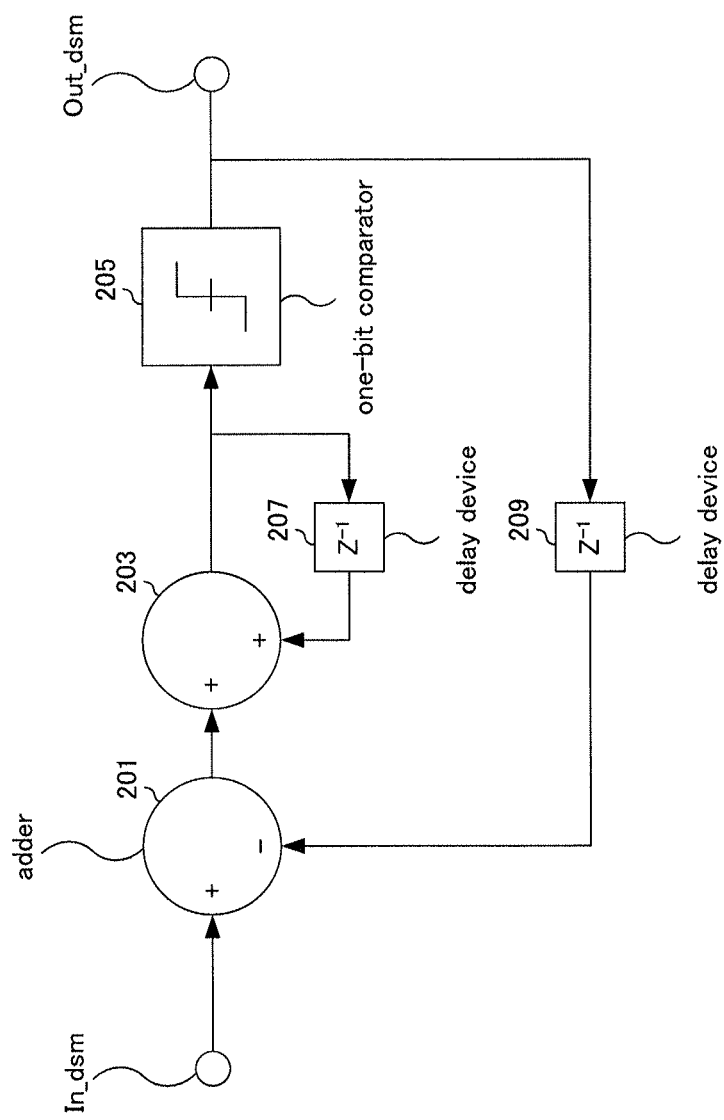
FIG. 3 is a circuit block diagram showing a configuration example of a conventional delta-sigma modulator.

When the configuration shown in FIG. 3 is used as a configuration example of k-th delta-sigma modulator 111-k, and when an input signal is set as DSMin_k, output signal DSMout_k of k-th delta-sigma modulator 111-k is expressed by the following expression.

$$DSMout\_k = DSMin\_k + (1-z^{-1})Ek(z) \quad (9)$$

In this expression, Ek(z) is quantization noise generated in the k-th delta-sigma modulator.

The output signals (respectively set as DSMout_1, DSMout_2, . . . , DSMout_N) of the N delta-sigma modulators described above are inputted into encoder 113. Encoder 113 shifts the levels of the output signals of respective delta-sigma modulators 111-k according to the following expression, and then adds up the output signals. When the output signal of encoder 113 is set as Eout, Eout is expressed by the following expression.

$$Eout = [S(1)\cdot(DSMout\_1+B) + S(2)\cdot(DSMout\_2+B+1\cdot Vstep) + \ldots + S(k)(DSMout\_k+B+(k-1)\cdot Vstep) + \ldots + S(N)\cdot(DSMout\_N+B+(N-1)\cdot Vstep)]/(N\cdot A) \quad (10)$$

In expression (10), Vstep and B are expressed as follows.

$$Vstep = VMAX\_DSM - VMIN\_DSM \quad (11)$$

$$B = A\cdot N\cdot VMIN - VMIN\_DSM$$

S(1), S(2), ..., S(N) are control signals generated by N region divider 101. In the case where a signal inputted into N region divider 101 is in the range expressed by expression (5), S(k) is set to 1, and the other control signals (that is, S(1), ..., S(k−1), S(k+1), ..., S(N)) are set to 0. That is, when the signal inputted into N region divider 101 is expressed by expression (5), the term including the output signal (DSMout_k) of k-th delta-sigma modulator 111-k, is outputted as the output of encoder 113, and the values of the terms including the output signals of the other delta-sigma modulators are set to zero. In this case, according to expressions (9) to (11), Eout is expressed by the following expression.

$$Eout=[DSMin\_k+(1-z^{-1})\cdot Ek(z)+B+(k-1)\cdot Vstep]/(A\cdot N) \quad (12)$$

Since it is considered that DSMin_k is equal to Vtune_out_k, and that Vtune_in_k is Vin in expression (8), expression (12) is expressed by the following expression.

$$Eout=Vin+(1-z^{-1})\cdot Ek(z)/(A\cdot N) \quad (13)$$

As described above, Ek(z) is a quantization noise generated in the quantizer of the delta-sigma modulator.

Here, for comparison, when it is assumed that input signal Vin is inputted into the delta-sigma modulator which is shown in FIG. 3 and which has a input possible range set between VMAX and VMIN, output signal Eout_ref is expressed by the following expression.

$$Eout\_ref=Vin+(1-z^{-1})\cdot Eref(z) \quad (14)$$

Note that Eref(z) is quantization noise generated in the delta-sigma modulator.

In the delta-sigma modulator shown in FIG. 3, the maximum and minimum values in the input possible range are respectively equal to two output values of the internal one bit quantizer of the delta-sigma modulator. Since it is thought that the value of quantization noise generated in the quantizer is proportional to the difference between two output values of the quantizer, the following relational expression is established between Ek(z) and Eref(z).

$$Ek(z)=A\cdot Eref(z) \quad (15)$$

When expression (15) replaces Ek(z) of expression 13, the following expression is obtained.

$$Eout=Vin+(1-z^{-1})\cdot Eref(z)/N \quad (16)$$

Expression (14) and expression (16) mean that quantization noise generated in the digital modulator according to the exemplary embodiment is reduced to 1/N of the quantization noise generated in the delta-sigma modulator. Each of the quantizers, which are respectively provided in the N delta-sigma modulators included in the digital modulator of the exemplary embodiment, is a one-bit comparator. Therefore, the digital modulator of the exemplary embodiment can reduce quantization noise without lowering the operation clock as compared with the conventional delta-sigma modulator.

Note that, when N region divider 101, and N level adjusters 103-1 to 103-N are seen as one signal adjuster 105 (the input signal of signal adjuster 105 is the same as input signal Vin of N region divider 101, and signal adjuster 105 has N output signals which are the same as output signals of Vtune_out_1, ..., Vtune_out_N of first level adjusting circuit 103-1 to N-th level adjusting circuit 103-N), and when, for input signal Vin, a value of k is set so as to satisfy expression (5), the following relational expression is established between input signal Vin and output signal Vtune_out_k of signal adjuster 105 of the exemplary embodiment.

$$Vtune\_outk=A\cdot N\cdot Vin-A\cdot(N-k+1)\cdot VMIN-A\cdot(k-1)\cdot VMAX+VMIN\_DSM \quad (17)$$

Signal adjuster 105 having any configuration can realize the effects of the exemplary embodiment, as long as the configuration can realize the above-described expression. Therefore, it is not necessary that the configuration of signal adjuster 105 be limited to the above-described combination of N region divider 101 with N level adjusters 103-1 to 103-N.

As the delta-sigma modulator included in the exemplary embodiment, a delta-sigma modulator having any configuration may be used other than the delta-sigma modulator shown in FIG. 3. Also, the delta-sigma modulator included in the exemplary embodiment can be replaced by a modulator, such as a delta modulator, other than the delta-sigma modulator. In addition, in the case where the delta-sigma modulator included in the exemplary embodiment is replaced, a part of the N delta-sigma modulators can be replaced, or all of the N delta-sigma modulators can be replaced. When the replacement is performed, it is preferable that, in each of the signal adjusters respectively connected to the delta-sigma modulators, the level of the input signal of the signal adjuster be adjusted so that the output signal of the signal adjuster falls within the input possible range of the delta-sigma modulator. That is, when the input signal of the level adjuster is set as Vtune_in_k, and when the output signal of the level adjuster is set as Vtune_out_k, it is preferable that a combination of the parameters D and E in the following expression be applied so that the parameter D becomes as large as possible.

$$Vtune\_out\_k=D\cdot Vtune\_in\_k+E \quad (18)$$

Moreover, the quantizer included in delta-sigma modulator 111-k may be replaced by a multi-value comparator other than the one-bit comparator, or the delta-sigma modulator may be replaced by a delta modulator.

(A Second Exemplary Embodiment)

Figure 5:
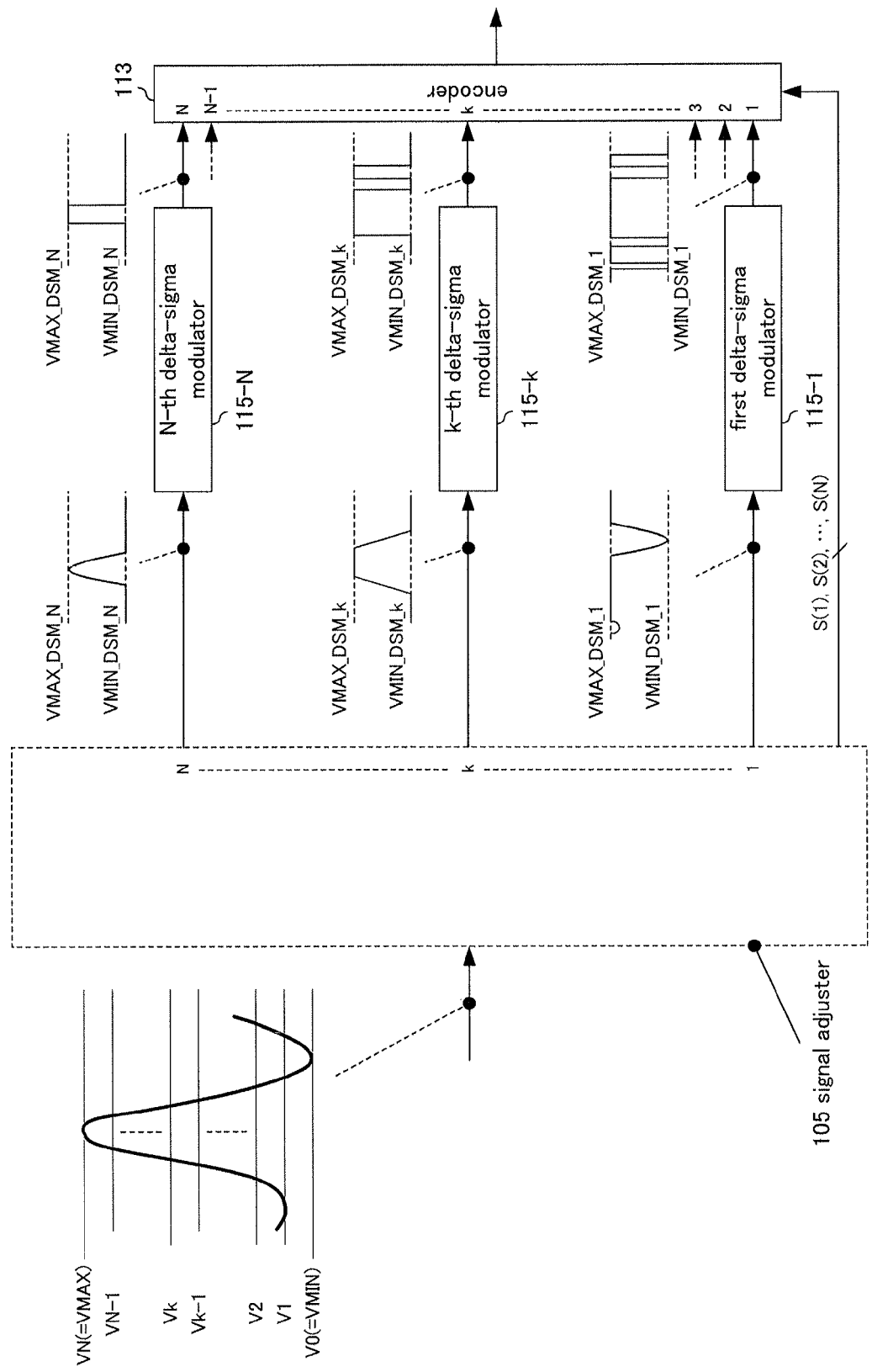
FIG. 5 is a circuit block diagram showing a configuration example of a digital modulator according to a second exemplary embodiment.

Next, FIG. 5 shows a best mode for carrying out a second invention. A digital modulator according to the exemplary embodiment includes signal adjuster 105, delta-sigma modulators 115-1 to 115-N, and encoder 113, similarly to the exemplary embodiment of the first invention.

Signal adjuster 105 has N output terminals. That is, signal adjuster 105 has a first output terminal, a second output terminal, an N-th output terminal. As will be described below, signal adjuster 105 outputs a signal from each of the output terminals according to the level of an input signal. N delta-sigma modulators are included in the digital modulator according to the exemplary embodiment. That is, first delta-sigma modulator 115-1, N-th delta delta-sigma modulator 115-N are included in the digital modulator according to the exemplary embodiment. The output signal from the k-th output terminal of signal adjuster 105 is inputted into k-th delta-sigma modulator 115-k.

The maximum and minimum values of the input possible level of signal adjuster 105 are respectively set as VMAX and VMIN. In addition, (N+1) voltage values are respectively set as V_0, V_1, V_2, ..., V_N in ascending order of value, and V_0 and V_N are respectively set to be equal to VMIN and VMAX.

When k is set as an integer between 1 and N, and when input signal Vin is in the range expressed by expression (19), signal Vtune_out_k expressed by expression (20) is outputted from the k-th output terminal.

$$V\_(k-1)<Vin<V\_k \quad (19)$$

Note that each of the two inequality signs of the above expression may be replaced by the sign ≤.

$$Vtune\_out\_k=G\_k\cdot(Vin-V\_(k-1))+VMIN\_DSM\_k \quad (20)$$

In this expression, G_k is expressed as follows:

$$G\_k=(V\text{MAX\_DSM}\_k-V\text{MIN\_DSM}\_k)/(V\_k-V\_(k-1)) \quad$$

Here, VMAX_DSM_k and VMIN_DSM_k are respectively the maximum and minimum values of the input possible range of k-th delta-sigma modulator 115-k. The k-th output terminal is connected to k-th delta-sigma modulator 115-k.

Further, a fixed voltage value is outputted from terminals other than the k-th output terminal.

For example, when p is set as an integer between 1 and k−1, a voltage value expressed by the following expression is outputted from the p-th output terminal, $$V\text{MAX\_DSM}\_p \quad (21)$$

Other value may be outputted from the p-th output terminal.

When q is set as an integer between k+1 and N, a voltage value expressed by the following expression is outputted from the q-th output terminal.

$$V\text{MIN\_DSM},q \quad (22)$$

Other value may be outputted from the q-th output terminal.

When the values expressed by expressions (21) and (22) are respectively used as outputs of the p-th terminal and the q-th terminal, and when r is set as an arbitrary integer, that means that the maximum value of the voltage signal outputted from the r-th output terminal is VMAX_DSM_r, and that the minimum value of the voltage signal outputted from the r-th output terminal is VMIN_DSM_r.

Moreover, signal adjuster 105 generates N control signals of S(1), S(2), . . . , S(N). In the case where the signal inputted into signal adjuster 105 is in the range expressed by expression (19), control signal S(k) is set to 1, and the other control signals (S(1), . . . , S(k−1), S(k+1), . . . , S(N)) are set to 0. That is, the control signal expresses the level of input signal Vin of the signal adjuster in N stages. The control signals are inputted into encoder 113 and used for internal arithmetic processing in encoder 113.

When the delta-sigma modulator shown in FIG. 3 is used as k-th delta-sigma modulator 115-k, and when an input signal of k-th delta-sigma modulator 115-k is set as DSMin_k, output signal DSMout_k of k-th delta-sigma modulator 115-k is expressed by the following expression.

$$\text{DSMout}\_k=\text{DSMin}\_k+(1-z^{-1})\cdot Ek(z) \quad (23)$$

In this expression, Ek(z) is quantization noise generated in the k-th delta-sigma modulator.

The output signals (respectively set as DSMout_1, DSMout_2, DSMout_N) of N delta-sigma modulators 115-1 to 115-N described above are inputted into encoder 113. Encoder 113 shifts the levels of the output signals of respective delta-sigma modulators 115-k according to the following expression, and then adds up the output signals. When the output signal of encoder 113 is set as Eout, Eout is expressed by the following expression.

$$E\text{out}=\Sigma S(k)[(\text{DSMout}\_k-V\text{MIN\_DSM}\_k)/G\_k+V\_(k-1)] \quad (24)$$

S(1), S(2), . . . , S(N) are control signals generated by signal adjuster 105. In the case where a signal inputted into signal adjuster 105 is expressed by expression (19), S(k) is set to 1, and the other control signals (that is, S(1), . . . , S(k−1), S(k+1), S(N)) are set to 0. That is, when the signal inputted into signal adjuster 105 is expressed by expression (19), only the term in expression (19), the term including the output signal (DSMout_k) of k-th delta-sigma modulator 115-k, is outputted as the output of encoder 113, and the terms including the output signals of the other delta-sigma modulators 115-j (k≠j) are set to be zero. In this case, according to expressions (24) and (25), Eout is expressed by the following expression.

$$E\text{out}=(\text{DSMout}\_k-V\text{MIN\_DSM}\_k)/G\_k+V\_(k-1) \quad (26)$$

When DSMout_k is replaced by expression (23), the following expression is obtained.

$$E\text{out}=(\text{DSMin}k+(1-z^{-1})Ek(z)-V\text{MIN\_DSM}\_k)/G\_k+V\_(k-1) \quad (27)$$

DSMin_k is the same as Vtune_out_k, and hence when the right side of expression (20) is replaced by DSMin_k, the following expression is obtained.

$$E\text{out}=V\text{in}+(1-z^{-1})Ek(z)/G\_k \quad (28)$$

As described above, Ek(z) is quantization noise generated in the quantizer 115-k of the delta-sigma modulator.

Here, for comparison, when it is assumed that input signal Vin is inputted into the delta-sigma modulator which is shown in FIG. 3 and which has an input possible range set between VMAX and VMIN, output signal Eout_ref is expressed by the following expression.

$$E\text{out\_ref}=V\text{in}+(1-z^{-1})\cdot E\text{ref}(z) \quad (29)$$

Note that Eref(z) is quantization noise generated in the delta-sigma modulator.

In the delta-sigma modulator shown in FIG. 3, the maximum and minimum values in the input possible range are respectively equal to two output values of the internal one bit quantizer. The value of quantization noise generated in the quantizer is proportional to the difference between the two output values of the quantizer, and hence the following relational expression is established between Ek(z) and Eref(z).

$$Ek(z)=(V\text{MAX\_DSM}\_k-V\text{MIN\_DSM}\_k)/(V\text{MAX}-V\text{MIN})\cdot E\text{ref}(z) \quad (30)$$

When Ek(z) of expression (28) is replaced by expression (30), the following expression is obtained.

$$E\text{out}=V\text{in}+(1-z^{-1})\cdot E\text{ref}(z)/NN \quad (31)$$

In this expression, NN is expressed as follows:

$$NN=(V\text{MAX}-V\text{MIN})/(V\_k-V\_(k-1)) \quad (32)$$

Expression (29) and expression (31) mean that quantization noise generated in the digital modulator according to the exemplary embodiment is reduced to 1/ NN of quantization noise generated in the delta-sigma modulator. Each of the quantizers, which are respectively provided in the N delta-sigma modulators included in the digital modulator of the exemplary embodiment, has a one-bit comparator, and hence the digital modulator of the exemplary embodiment can reduce the quantization noise without lowering the operation clock as compared with the conventional delta-sigma modulator.

As the delta-sigma modulator included in the exemplary embodiment, a delta-sigma modulator having any configuration may be used other than the delta-sigma modulator shown in FIG. 3. Also, the delta-sigma modulator included in the exemplary embodiment can be replaced by a modulator, such as a delta modulator, other than the delta-sigma modulator. In addition, in the case where the delta-sigma modulator included in the exemplary embodiment is replaced, a part of the N delta-sigma modulators can be replaced, or all of the N delta-sigma modulators can be replaced. When the replacement is performed, it is preferable that, in each of the signal adjusters respectively connected to the delta-sigma modulators, the level of the input signal of the signal adjuster be adjusted so that the output signal of the signal adjuster falls within the input possible range of the delta-sigma modulator. That is, when the input signal of the level adjuster is set as Vtune_in_k, and when the output signal of the level adjuster is set as Vtune_out_k, it is preferable that a combination of the parameters D and E in the following expression be applied so that the parameter D becomes as large as possible.

$$Vtune\_out\_k = D \cdot Vtune\_in\_k + E \quad (33)$$

(A Third Exemplary Embodiment)

Figure 6:
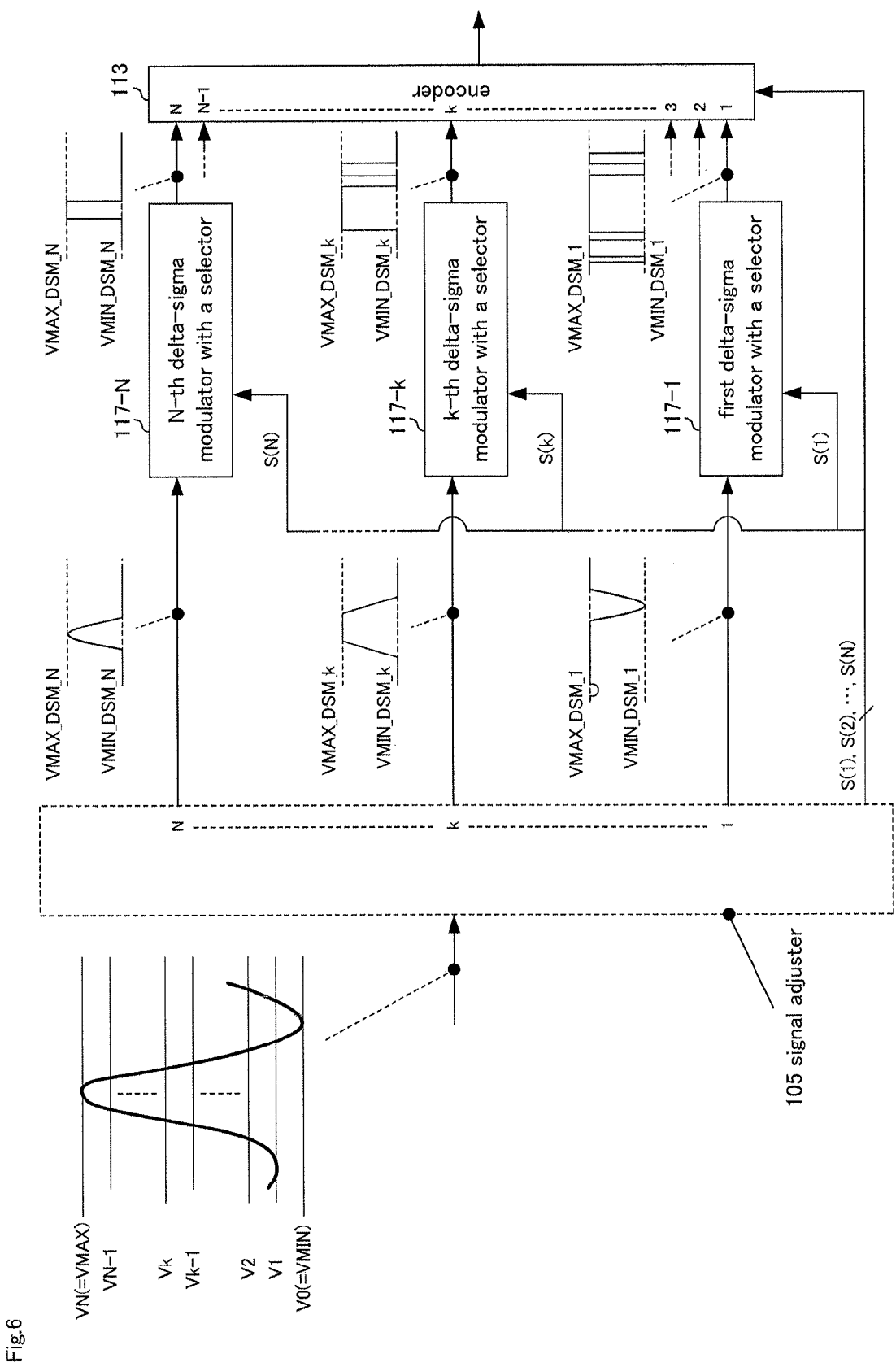
FIG. 6 is a circuit block diagram showing a configuration example of a digital modulator according to a third exemplary embodiment.

Next, FIG. 6 shows a best mode for carrying out a third invention. The exemplary embodiment includes signal adjuster 105, delta-sigma modulators 117-1 to 117-N each provided with a selector, and encoder 113.

Signal adjuster 105 and encoder 113 are the same as signal adjuster 105 and encoder 113 which are described in the exemplary embodiment of the second invention. Moreover, the digital modulator according to the exemplary embodiment includes N delta-sigma modulators 117-1 to 117-N each provided with a selector. That is, the digital modulator according to the exemplary embodiment includes first delta-sigma modulator 117-1 with a selector, second delta-sigma modulator 117-2 with a selector, ..., N-th delta-sigma modulator 117-N with a selector. When k is set as an integer between 1 and N, the maximum and minimum values of the input possible range of delta-sigma modulator 117-k with a selector are respectively expressed as VMAX_DSM_k and VMIN_DSM_k.

The digital modulator according to the exemplary embodiment corresponds to a configuration in which the first delta-sigma modulator to the N-th delta-sigma modulator of the exemplary embodiment of the second invention are respectively replaced by the first delta-sigma modulator with a selector to the N-th delta-sigma modulator with a selector.

Figure 7:
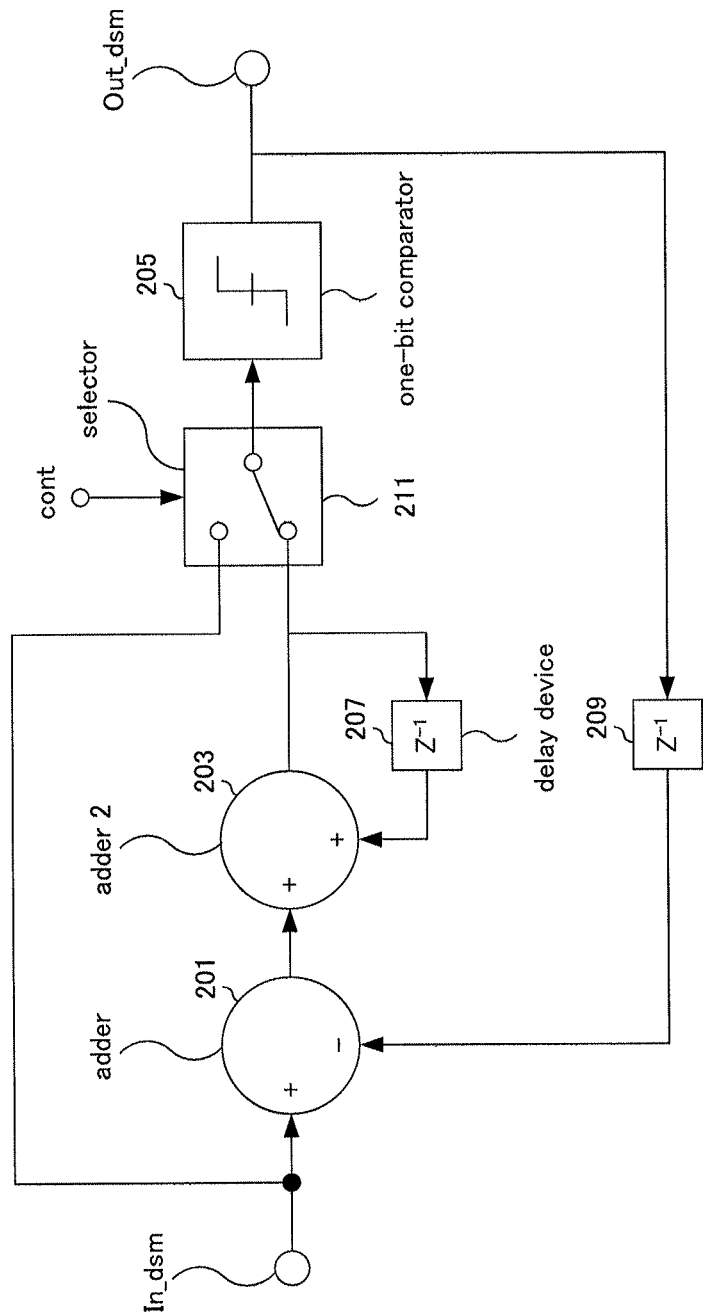
FIG. 7 is a circuit block diagram showing a configuration example of a delta-sigma modulator provided with a selector.

FIG. 7 is a block diagram showing an example of a delta-sigma modulator with a selector. The delta-sigma modulator with a selector shown in FIG. 7 includes adders 201 and 203, one-bit comparator 205, delay devices 207 and 209, and selector 211. The k-th delta-sigma modulator with a selector according to the exemplary embodiment has a configuration in which, in the conventional delta-sigma modulator shown in FIG. 3, selector circuit 211 is provided at the preceding stage of one-bit comparator 205. Selector circuit 211 has control terminal cont, and selects a signal inputted into one-bit comparator 205 according to the signal inputted into control terminal cont. S(k), which is one of N control signals generated by signal adjuster 105, is inputted into control terminal cont. When S(k) is 1, selector circuit 211 selects the output signal of adder 2. In this state, the delta-sigma modulator with a selector according to the exemplary embodiment is configured similarly to the conventional delta-sigma modulator shown in FIG. 3. When S(k) is 0, selector circuit 211 selects the input signal of the modulator. Thereby, when S(k) is 0, it is possible to prevent a signal obtained by delaying the input signal of one-bit comparator 205 and a feedback signal including a signal obtained by delaying the input signal of one-bit comparator 205 from being inputted into one-bit comparator 205. Therefore, the noise in the output of the modulator can be reduced.

Figure 8:
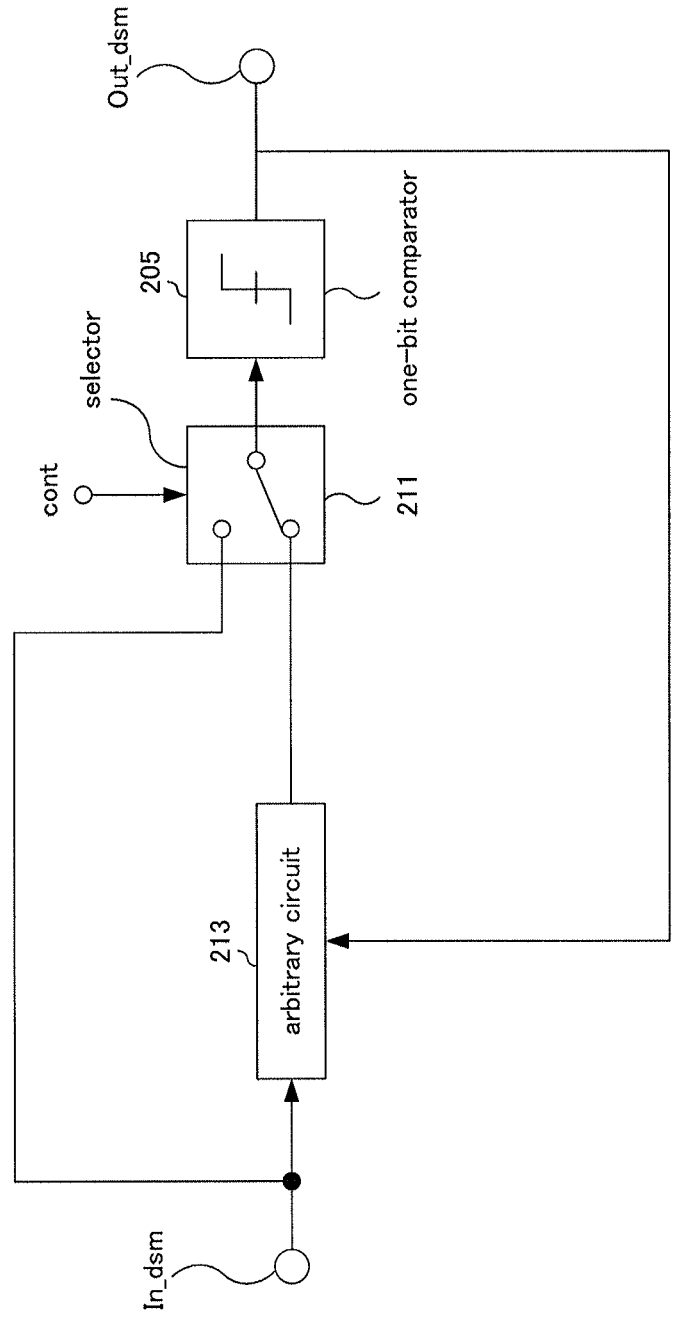
FIG. 8 is a circuit block diagram showing a configuration example of a delta-sigma modulator provided with a selector.

FIG. 8 shows a block diagram showing another example of the k-th delta-sigma modulator with a selector. The delta-sigma modulator with a selector shown in FIG. 8 includes one-bit comparator 205, selector circuit 211, and arbitrary circuit 213. The k-th delta-sigma modulator with a selector shown in FIG. 8 is different from the k-th delta-sigma modulator with a selector shown in FIG. 7 in that adders 201 and 203 and delay devices 207 and 209 are replaced by arbitrary circuit 213. When S(k) is 0, the k-th delta-sigma modulator with a selector shown in FIG. 8 can also prevent the feedback signal from being inputted into one-bit comparator 205. Therefore, it is possible to reduce the noise in the output of the modulator.

Figure 9:
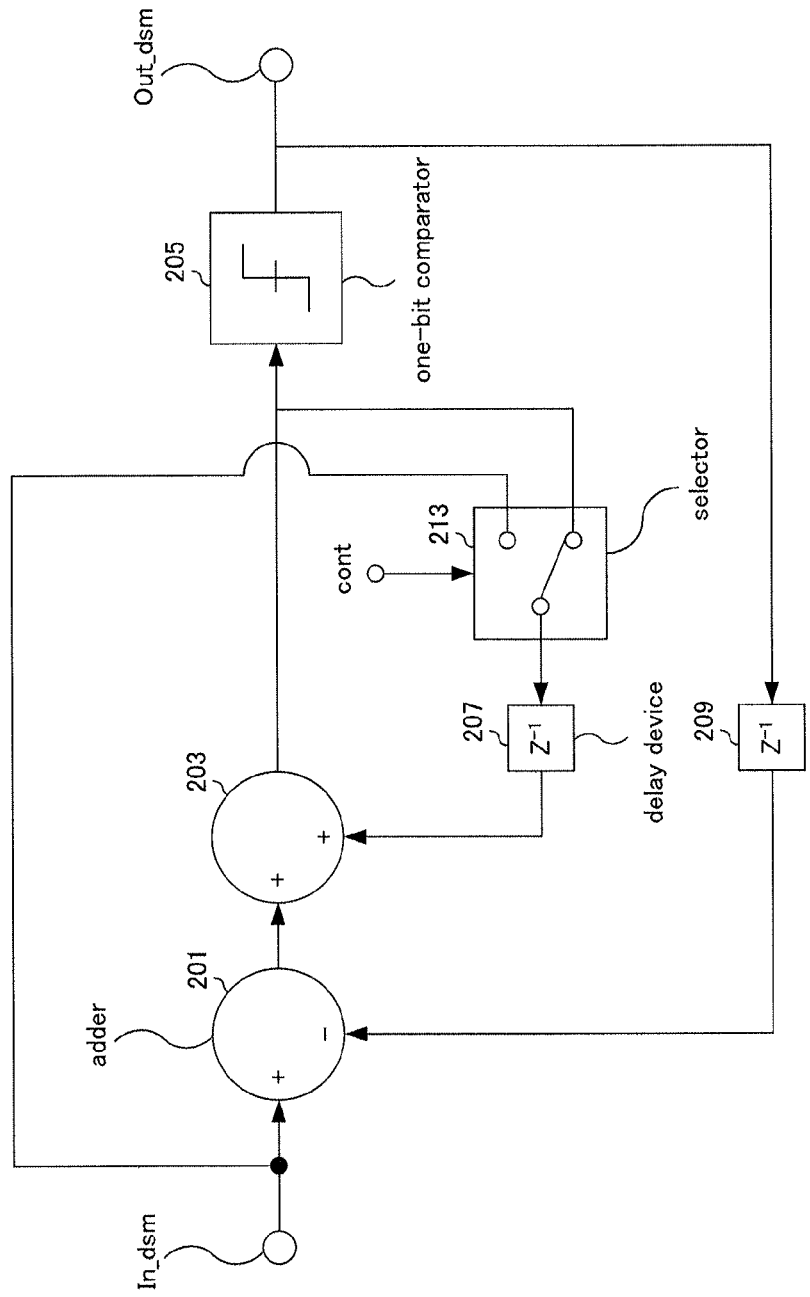
FIG. 9 is a circuit block diagram showing a configuration example of a delta-sigma modulator provided with a selector.

FIG. 9 is a block diagram showing yet another example of the k-th delta-sigma modulator with a selector. The delta-sigma modulator with a selector shown in FIG. 9 includes adders 201 and 203, one-bit comparator 205, delay devices 207 and 209, and selector circuit 213. When S(k) is 0, the k-th delta-sigma modulator with a selector shown in FIG. 9 can also prevent the feedback signal obtained by delaying the input signal of one-bit comparator 205 from being inputted into one-bit comparator 205. Therefore, it is possible to reduce the noise in the output of the modulator.

In the digital modulator, a signal is amplified before being subjected to delta sigma modulation, and hence it is possible to increase the signal power ratio with respect to the quantization noise generated at the time when the delta sigma modulation is performed. Therefore, the quantization noise with respect to the signal strength is relatively reduced. In addition, a conventional delta-sigma modulator having a one-bit quantizer can be used in the delta sigma modulation, and hence a conventional high-speed operation can be ensured.

Figure 10:
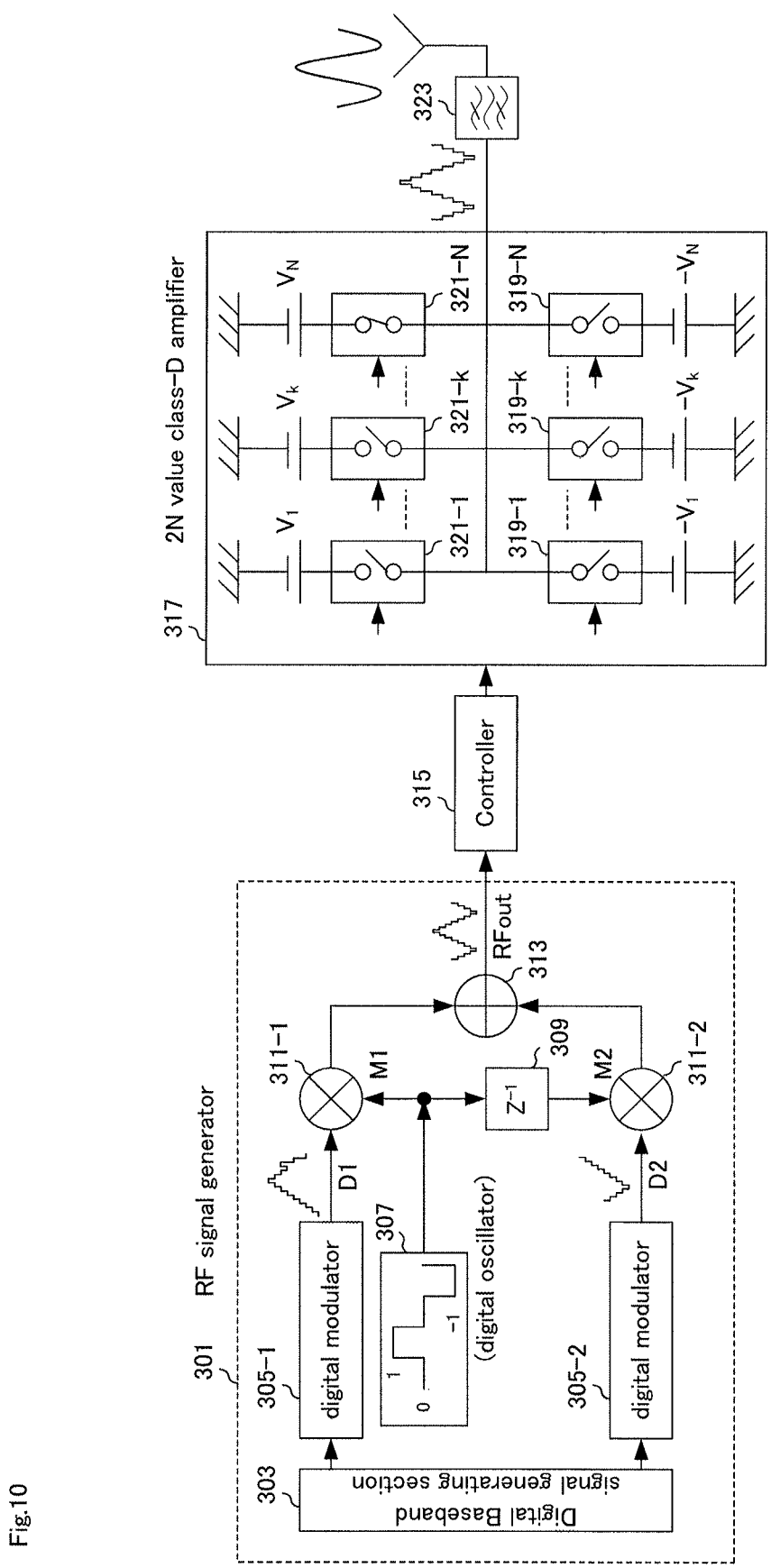
FIG. 10 is a circuit diagram showing a configuration of a transmission circuit according to an exemplary embodiment.

FIG. 10 shows a configuration of a transmission circuit including two digital modulators shown in FIG. 4 to FIG. 6. The transmission circuit shown in FIG. 10 includes RF signal generator 301, controller 315, and 2N value class-D amplifier 318 and band pass filter 323. RF signal generator 301 includes digital base-band signal generating section 303, digital modulators 305-1 and 305-2, digital oscillator 307, delay device 309, multipliers 311-1 and 311-2, and adder 313. 2N value class-D amplifier 317 includes power supplies $-V_N$, $-V_k$, ..., $-V_1$, $V_1$, $V_k$, ..., $V_N$, switches 319-1 to 319-N and 321-1 to 321-N.

Each of digital modulators 305-1 and 305-2 is one of the digital modulators shown in FIG. 4 to FIG. 6.

Digital base-band signal generating section 303 respectively outputs digital base band signals orthogonal to each other to digital modulators 305-1 and 305-2. Digital modulators 305-1 and 305-2 output the inputted digital base band signals to multipliers 311-1 and 311-2, respectively. Digital oscillator 307 outputs an oscillation signal which cyclically changes in order of 0→1→0→−1. Delay device 309 delays the oscillation signal by one clock time. Multiplier 311-1 multiplies the signal inputted from digital modulator 305-1 by the oscillation signal inputted from digital oscillator 307, and outputs the obtained first multiplication signal to adder 313. Multiplier 311-2 multiplies the signal inputted from digital modulator 305-2 by the oscillation signal inputted from delay device 309, and outputs the obtained second multiplication signal to adder 313. Therefore, the first multiplication signals are successively obtained as follows: output signal of digital modulator 305-1→0→-output signal of digital modulator 305-1→0. The second multiplication signals are successively obtained as follows: 0→output signal of digital modulator 305-2→0→-output signal of digital modulator 305-2. Adder 313 adds the first multiplication signal to the second multiplication signal, and outputs the obtained addition signal. Therefore, the first multiplication signal and the second multiplication signal are alternately and sequentially outputted as the addition signal. More specifically, the signals are successively outputted in the following order: output signal of digital modulator 305-1→output signal of digital modulator 305-2→-output signal of digital modulator 305-1→-output signal of digital modulator 305-2.

Switch 319-k is connected to power supply-$V_k$. Also, switch 321-k is connected to power supply $V_k$. Further, switches 319-1 to 319-N, and 321-1 to 321-N are connected to a common output line, and the common connecting line is connected to band pass filter 323.

The voltage of each of the power supplies corresponds to each level of the addition signal. Controller 315 turns on only the switch connected to the power supply corresponding to the level of the addition signal, and turns off the other switches. Therefore, an analog signal obtained by amplifying the addition signal is outputted to the common output line.

Band pass filter 323 receives the analog signal outputted to the common output line, and outputs only the pass band components of the analog signal.

A part or all of the exemplary embodiments described above can also be described as in the following additional description, but the present invention is not limited to these.

(Supplementary Note 1)

A digital modulator comprising:

a signal adjuster which includes a plurality of output lines and outputs, to the output line, which corresponds to a range to which a level of an input signal belongs, a signal of a level corresponding to the level of the input signal;

a plurality of internal digital modulators each of which is provided so as to correspond to each of the plurality of output lines and carries out delta-sigma modulation on the signal of the corresponding output line to output the modulated signal; and an encoder which encodes the plurality of modulated signals respectively outputted by said plurality of internal digital modulators.

(Supplementary Note 2)

The digital modulator according to Supplementary note 1, wherein said signal adjuster includes:

a region divider which includes a plurality of output lines and is configured, when the level of the input signal is within a certain range, to output a signal of a level corresponding to the level of the input signal to the output line of said region divider, the output line corresponding to the certain range; and a plurality of level adjusters each of which is provided to correspond to each of the plurality of output lines of said region divider and to correspond to each of said plurality of internal digital modulators, and outputs, to said corresponding internal digital modulator, the signal of the corresponding output line of said region divider after adjusting the signal.

(Supplementary Note 3)

The digital modulator according to Supplementary note 1 or 2, wherein said encoder encodes the plurality of modulated signals so that a maximum level of a certain modulated signal becomes equal to a minimum level of a modulated signal that is adjacent to the certain modulated signal in the range.

(Supplementary Note 4)

The digital modulator according to any one from among Supplementary notes 1 to 3, wherein at least one of said internal digital modulators includes a selector circuit which, when the range including the level of the input signal inputted into said digital modulator does not correspond to said internal digital modulator, does not add a feedback signal to the input signal inputted into said internal digital modulator, and supplies the input signal to a quantizer provided at said internal digital modulator.

(Supplementary Note 5)

The digital modulator according to any one from among Supplementary notes 1 to 3, wherein at least one of said internal digital modulators includes a selector circuit which, when the range including the level of the input signal inputted into said digital modulator does not correspond to said internal digital modulator, uses, as a feedback signal, the input signal inputted into said internal digital modulator instead of a signal supplied to a quantizer provided at said internal digital modulator.

(Supplementary Note 6)

The digital modulator according to any one from among Supplementary notes 1 to 4, wherein said internal digital modulator is a delta-sigma modulator or a delta modulator.

(Supplementary Note 7)

A transmission circuit comprising:

said digital modulator according to any one from among Supplementary notes 1 to 6;

a multiplier which multiplies the output of said digital modulator by an output of a digital oscillator; and an amplifier which connects an output line to a power supply having a voltage corresponding to a level of the output of said multiplier.

(Supplementary Note 8)

The transmission circuit according to Supplementary note 7, wherein said multiplier performs modulation so that a non-inverted signal and an inverted signal of the output of said digital modulator are cyclically arranged in the output of the multiplier.

(Supplementary Note 9)

A digital modulation method comprising:

a step in which a signal adjuster provided with a plurality of output lines outputs, to the output line, which corresponds to a range to which a level of an input signal belongs, a signal of a level corresponding to the level of the input signal;

a step in which each of a plurality of internal digital modulators, which are provided so as to respectively correspond to the plurality of output lines, carries out delta-sigma modulation on a signal of the corresponding output line and outputs the modulated signal; and a step in which an encoder encodes the plurality of modulated signals respectively outputted by said plurality of internal digital modulators.

(Supplementary Note 10)

The digital modulation method according to Supplementary note 9, wherein the signal adjuster includes a region divider provided with a plurality of output lines, and a plurality of level adjusters provided so as to respectively correspond to the plurality of output lines of the region divider and so as to respectively correspond to the plurality of internal digital modulators, and further including a step in which, when the level of the input signal is in a certain range, the region divider outputs a signal of a level corresponding to the level of the input signal to the output line of the region divider, the output line corresponding to the certain range, and a step in which each of the plurality of level adjusters adjusts the signal corresponding output line of the region divider, and then outputs the adjusted signal to the internal digital modulator corresponding to the level adjuster.

(Supplementary Note 11)

The digital modulation method according to Supplementary note 9 or 10, wherein the encoder encodes the plurality of modulated signals so that a maximum level of a certain modulated signal becomes equal to a minimum level of a modulated signal that is adjacent to the certain modulation signal in the range.

(Supplementary Note 12)
The digital modulation method according to any one from among Supplementary notes 9 to 11, further including
a step in which, when the range including the level of the input signal inputted into the digital modulator does not correspond to the internal digital modulator, a selector circuit provided at at least one of the internal digital modulators supplies an input signal for the internal digital modulator to a quantizer provided at the internal digital modulator, without adding a feedback signal to the input signal.

(Supplementary Note 13)
The digital modulation method according to any one from among Supplementary notes 9 to 12, further including
a step in which, when the range including the level of the input signal inputted into the digital modulator does not correspond to the internal digital modulator, a selector circuit provided at at least one of the internal digital modulators selects the input signal for the internal digital modulator as a feedback signal instead of a signal supplied to the quantizer provided at the internal digital modulator.

(Supplementary Note 14)
The digital modulation method according to any one from among Supplementary notes 9 to 13, wherein
the internal digital modulator is a delta-sigma modulator or a delta modulator.

(Supplementary Note 15)
A transmission method comprising:
each step in the digital modulation method according to any one from among Supplementary notes 9 to 14;
a step in which a multiplier multiplies the output of said digital modulator by an output of a digital oscillator; and
a step in which an amplifier connects an output line to a power supply having a voltage corresponding to a level of the output of said multiplier.

(Supplementary Note 16)
The transmission method according to Supplementary note 15, wherein
the multiplier performs modulation so that the non-inverted signal and the inverted signal of the output of the digital modulator are cyclically arranged in the output of the multiplier.

In the above, the present invention has been described with reference to the exemplary embodiments, but the present invention is not limited to the exemplary embodiments. A configuration and details of the present invention may be modified in various ways within the scope of the present invention in a manner that a person skilled in the art can understand.

This application claims the benefit of priority from Japanese Patent Application No. 2011-105156 filed in Japan on May 10, 2011, the entire content of which is hereby incorporated by reference in the application and claims of the present application.

What is claimed is:
1. A digital modulator comprising:
a signal adjuster which includes a plurality of output lines and outputs, to the output line, which corresponds to a range to which a level of an input signal belongs, a signal of a level corresponding to the level of the input signal;
a plurality of internal digital modulators each of which is provided so as to correspond to each of the plurality of output lines and carries out delta-sigma modulation on the signal of the corresponding output line to output the modulated signal; and
an encoder which encodes the plurality of modulated signals respectively outputted by said plurality of internal digital modulators.

2. The digital modulator according to claim 1, wherein said signal adjuster includes:
a region divider which includes a plurality of output lines and is configured, when the level of the input signal is within a certain range, to output a signal of a level corresponding to the level of the input signal to the output line of said region divider, the output line corresponding to the certain range; and
a plurality of level adjusters each of which is provided to correspond to each of the plurality of output lines of said region divider and to correspond to each of said plurality of internal digital modulators, and outputs, to said corresponding internal digital modulator, the signal of the corresponding output line of said region divider after adjusting the signal.

3. The digital modulator according to claim 1, wherein said encoder encodes the plurality of modulated signals so that a maximum level of a certain modulated signal becomes equal to a minimum level of a modulated signal that is adjacent to the certain modulated signal in the range.

4. The digital modulator according to claim 1, wherein at least one of said internal digital modulators includes a selector circuit which, when the range including the level of the input signal inputted into said digital modulator does not correspond to said internal digital modulator, does not add a feedback signal to the input signal inputted into said internal digital modulator, and supplies the input signal to a quantizer provided at said internal digital modulator.

5. The digital modulator according to claim 1, wherein at least one of said internal digital modulators includes a selector circuit which, when the range including the level of the input signal inputted into said digital modulator does not correspond to said internal digital modulator, uses, as a feedback signal, the input signal inputted into said internal digital modulator instead of a signal supplied to a quantizer provided at said internal digital modulator.

6. The digital modulator according to claim 1, wherein said internal digital modulator is a delta-sigma modulator or a delta modulator.

7. A transmission circuit comprising:
said digital modulator according to claim 1;
a multiplier which multiplies the output of said digital modulator by an output of a digital oscillator; and
an amplifier which connects an output line to a power supply having a voltage corresponding to a level of the output of said multiplier.

8. The transmission circuit according to claim 7, wherein said multiplier performs modulation so that a non-inverted signal and an inverted signal of the output of said digital modulator are cyclically arranged in the output of the multiplier.

9. A digital modulation method comprising:
a procedure in which a signal adjuster provided with a plurality of output lines outputs, to the output line, which corresponds to a range to which a level of an input signal belongs, a signal of a level corresponding to the level of the input signal;
a procedure in which each of a plurality of internal digital modulators, which are provided so as to respectively correspond to the plurality of output lines, carries out delta-sigma modulation on a signal of the corresponding output line and outputs the modulated signal; and a procedure in which an encoder encodes the plurality of modulated signals respectively outputted by said plurality of internal digital modulators.

10. The digital modulation method according to claim 9, wherein
the signal adjuster includes
a region divider provided with a plurality of output lines, and
a plurality of level adjusters provided so as to respectively correspond to the plurality of output lines of the region divider and so as to respectively correspond to the plurality of internal digital modulators, and
further including
a procedure in which, when the level of the input signal is in a certain range, the region divider outputs a signal of a level corresponding to the level of the input signal to the output line of the region divider, the output line corresponding to the certain range, and
a procedure in which each of the plurality of level adjusters adjusts the signal corresponding output line of the region divider, and then outputs the adjusted signal to the internal digital modulator corresponding to the level adjuster.

11. The digital modulation method according to claim 9, wherein
the encoder encodes the plurality of modulated signals so that a maximum level of a certain modulated signal becomes equal to a minimum level of a modulated signal that is adjacent to the certain modulation signal in the range.

12. The digital modulation method according to claim 9, further including
a procedure in which, when the range including the level of the input signal inputted into the digital modulator does not correspond to the internal digital modulator, a selector circuit provided at at least one of the internal digital modulators supplies an input signal for the internal digital modulator to a quantizer provided at the internal digital modulator, without adding a feedback signal to the input signal.

13. The digital modulation method according to claim 9, further including
a procedure in which, when the range including the level of the input signal inputted into the digital modulator does not correspond to the internal digital modulator, a selector circuit provided at at least one of the internal digital modulators selects the input signal for the internal digital modulator as a feedback signal instead of a signal supplied to the quantizer provided at the internal digital modulator.

14. The digital modulation method according to claim 9, wherein
the internal digital modulator is a delta-sigma modulator or a delta modulator.

15. A transmission method comprising:
each of said procedures of the digital modulation method according to claim 9;
a procedure in which a multiplier multiplies the output of said digital modulator by an output of a digital oscillator; and
a procedure in which an amplifier connects an output line to a power supply having a voltage corresponding to a level of the output of said multiplier.

16. The transmission method according to claim 15, wherein
the multiplier performs modulation so that the non-inverted signal and the inverted signal of the output of the digital modulator are cyclically arranged in the output of the multiplier.

* * * * *